(12) United States Patent
Ma et al.

(10) Patent No.: US 6,226,221 B1
(45) Date of Patent: May 1, 2001

(54) METHOD AND APPARATUS FOR REDUCING BLEED CURRENTS WITHIN A DRAM ARRAY HAVING ROW-TO-COLUMN SHORTS

(75) Inventors: Manny Kin F. Ma; Brian Shirley, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/521,756

(22) Filed: Mar. 9, 2000

Related U.S. Application Data

(62) Division of application No. 09/137,779, filed on Aug. 20, 1998.

(51) Int. Cl.$^7$ .................................................. G11C 8/00
(52) U.S. Cl. ................... 365/230.08; 369/189.09
(58) Field of Search ........................... 369/230.08, 189.09

(56) References Cited

U.S. PATENT DOCUMENTS

| | | | |
|---|---|---|---|
| 5,235,550 | 8/1993 | Zagar | 365/226 |
| 5,552,739 | 9/1996 | Keeth et al. | 327/538 |
| 5,557,579 | 9/1996 | Raad et al. | 365/226 |
| 5,732,033 | 3/1998 | Mullarkey et al. | 365/201 |
| 5,734,617 | * 3/1998 | Zheng | 365/225.7 |

* cited by examiner

Primary Examiner—David Nelms
Assistant Examiner—M. Tran
(74) Attorney, Agent, or Firm—Trask Britt

(57) ABSTRACT

A DRAM memory array is disclosed that uses a current limiting circuit employing current feedback to clamp the current flow to reduced levels than were previously possible. The current limiting circuit comprises a long length, depletion mode transistor that has its gate voltage reduced when row-to-column shorts exist to limit the bleed current. An alternative embodiment uses a P-channel FET in series with the depletion mode transistor and has its gate tied to a negative supply and passes current until both digit lines approach approximately 0.3 Volts.

6 Claims, 5 Drawing Sheets

METHOD AND APPARATUS FOR REDUCING BLEED CURRENTS WITHIN A DRAM ARRAY HAVING ROW-TO-COLUMN SHORTS

CROSS REFERENCE TO RELATED APPLICATION

This application is a divisional of application Ser. No. 09/137,779, filed Aug. 20, 1998, pending.

BACKGROUND OF THE INVENTION

1. Field of the Invention

This invention relates generally to integrated memory circuits and, more specifically, to techniques for limiting bleed current in row-to-column shorts within dynamic random access memory array circuitry.

2. State of the Art

Integrated circuit technology has come a long way, from a few random transistors fabricated on a single die to extremely complex and dense microprocessing units and random access memory devices currently available. Memory circuits, such as dynamic random access memory (DRAM) arrays, have increased in complexity and density over time. With such increased density and complexity, it is very likely that one or more shorts will occur between a word line (generally referred to as a "row" within the array) and a digit line (generally referred to as a "column" within the array).

A row-to-column short typically is a point defect that shorts together a particular row line to a perpendicular digit line. Such a defect generally ruins the integrity of both the row and column. Spare rows and spare columns are created within the DRAM array in combination with address redirection circuitry in order to substitute functional spare rows and columns for those that are shorted—at least to the extent that shorted rows and columns do not exceed the number of spare rows and columns. Even though this on-chip redundancy allows for the repair of a DRAM integrated circuit device, it is important to note that the shorted columns and rows are not disconnected from the array circuitry. The shorted columns and rows are merely no longer addressed by the array's address decode circuitry. Disconnection of the shorted rows and columns from the array circuitry is impractical—if not impossible—with presently available technology due to the small interword line and interdigit line pitch used to fabricate DRAM arrays. Schemes for implementing row and column redundancy in DRAM arrays are well known in the art, and it is not necessary to further detail these structures at this time.

The repair of row to column shorts through redirected addressing does not eliminate the presence of shorts within the array, nor does it eliminate the potential for biased voltage pull down with the attendant problems of excessive standby current, read/write operations resulting in invalid data and possible damage to cell capacitors within the array. For example, one serious problem is that of an increase in the quiescent standby current because of a defect in the circuit. In standby mode, all the row lines are actively held to ground, while the digits are ideally held to an intermediate supply also known as DVC2 ($V_{cc}/2$), in anticipation of a new access. The row-to-column short therefore acts to short DVC2 to ground, giving a much higher standby current than is otherwise necessary or desired.

Since such short defects cannot be eradicated entirely, large DRAM arrays have resorted to the use of "bleeder" circuits, which act to limit the amount of supply current that actively holds a digit line to DVC2. A schematic example of a low-current bleeder device used in the prior art is depicted in drawing FIGS. 1A and 1B, where drawing FIG. 1A is the schematic electronic diagram while drawing FIG. 1B is a schematic typography of a fabricated memory array. Two, or more, NMOS transistors 10 accompany an equilibrating polysilicon gate transistor 12 to provide a bias level to $V_{cc}$ volts. Transistors 10 and 12 operate in conjunction with equilibration to ensure that the digit line pair remains at the prescribed voltage for sensing. Patent digit lines D and D* are a complementary pair that is at Vcc and ground equilibrate to Vcc/2 volts. The bias devices ensure that this occurs and also guarantee that the digit lines remain at Vcc/2, despite leakage paths that would otherwise discharge them. A current limiting device 14 is placed in series between the shared node 16, which is a polysilicon gate tied to VCC, and DVC2 bias voltage generator bus 18 (also known as Vcc/2). Current limiting device 14 is a long length (long L), low-current bleeder device 14 that limits the amount of supply current by actively holding the digit line to DVC2. For this example, the row line, which is held low in $t_{RP}$ for the time necessary to precharge the row because the row is shorted with the column, leaks some current through the transistor 12 when the equilibrate line is held high during $t_{RP}$. Typically, current limiting device 14 limits the current of a row-column short to approximately 10 microamperes ($\mu$A), which is substantially under the standby current specifications.

As DRAM array sizes grow, however, row-to-column shorts become more prevalent. As such, there is a desire to reduce this current even further to yield dice with a substantial number of row/column shorts and to keep the quiescent standby current in a more tightly controlled range. Unfortunately, the dimensions of current limiting device 14 limit the amount of current that can be reduced and the row-to-column shorts cause current limiting device 14 to operate in a high-current mode. Accordingly, what is needed is a memory array current limiting circuit that reduces the amount of current drawn even further without necessarily having to reduce the size of the bleeder transistor

SUMMARY OF THE INVENTION

According to the present invention, a DRAM memory array is disclosed that uses a current limiting circuit employing current feedback to clamp the current flow to levels lower than were previously possible. The current limiting circuit comprises a long length, depletion mode transistor that has its gate voltage reduced when row-to-column shorts exist to limit the bleed current. An alternative embodiment uses a P-channel FET in series with the depletion mode transistor and has its gate tied to a negative supply and passes current until both digit lines approach approximately 0.3 Volts.

DETAILED DESCRIPTION OF THE INVENTION

Figure 1A:
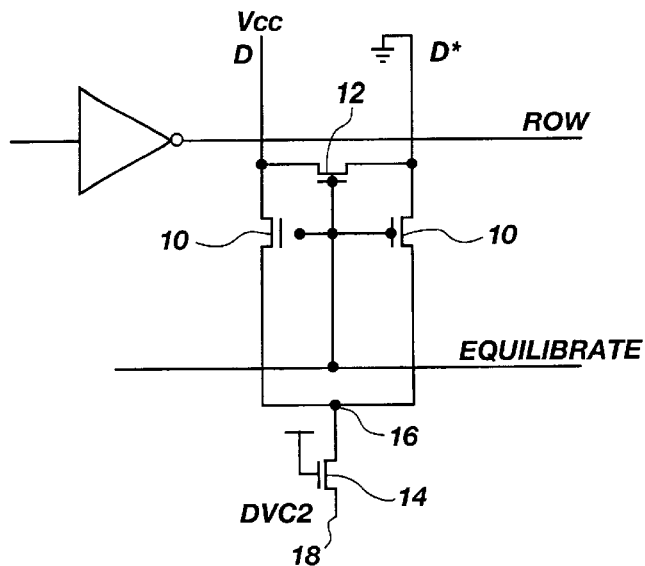
FIGS. 1A and 1B are schematic diagrams of a prior art current limiting circuit used in a DRAM array.
Figure 2A:
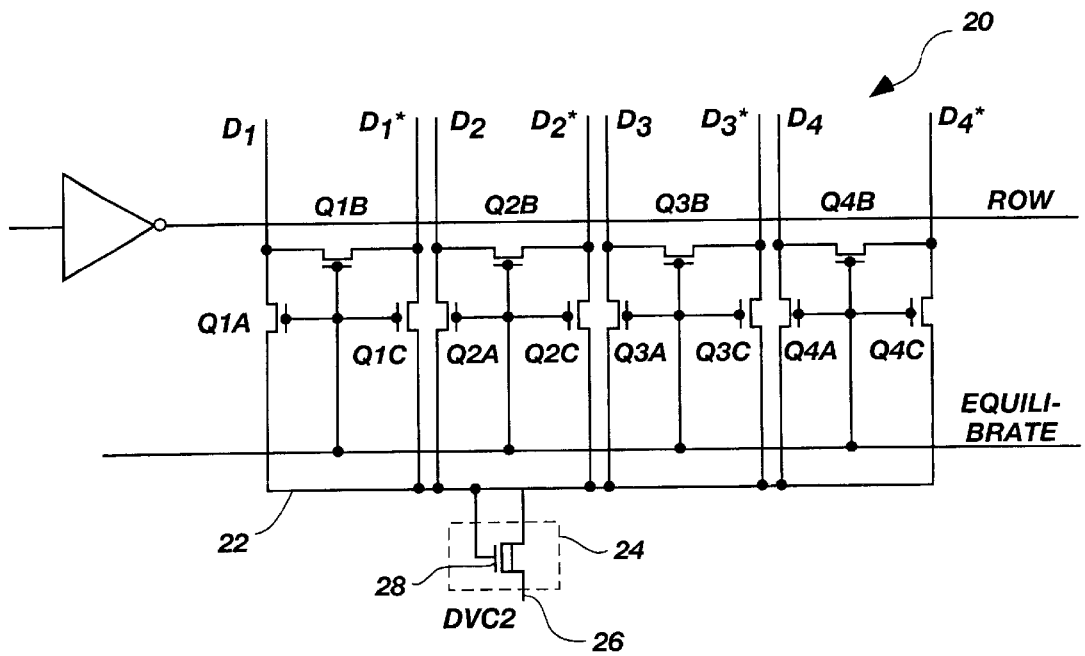
FIGS. 2A and 2B are schematic diagrams of a current limiting circuit using current feedback for use in a DRAM array according to the present invention.
Figure 1B:
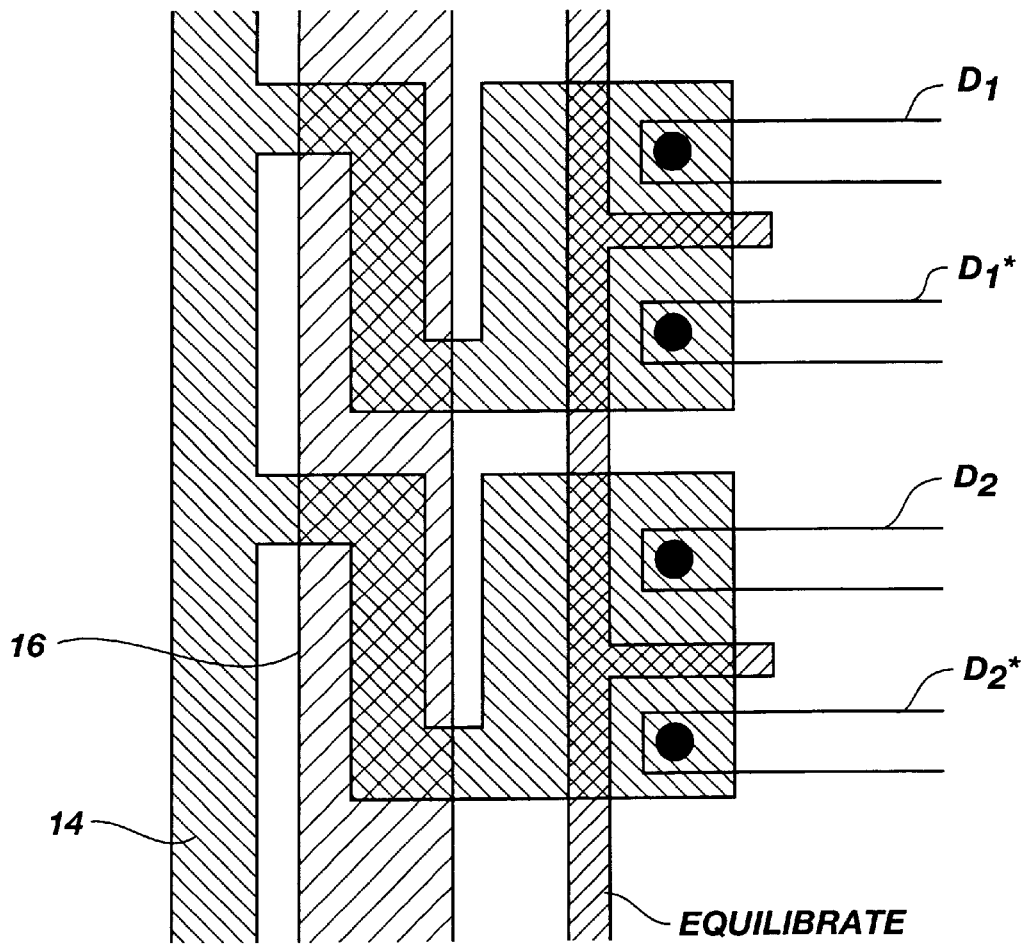

Illustrated in drawing FIG. 2A is a schematic diagram depicting a low-current array current limiting or bleeder circuit 20 according to the present invention. Bleeder circuit 20 is intended to be used in a dynamic random access memory (DRAM) device found within a computer system. Although the present invention will be described with respect to this embodiment, which includes a DRAM device, it will be understood by those having skill in the field of this invention that the present invention includes within its scope any electronic device, including a processor device having cache memory.

An example of an exemplary DRAM circuit in which the present invention is incorporated is found in U.S. Pat. No. 5,552,739, entitled Integrated Circuit Power Supply Having Piece-Wise Linearity, herein incorporated by reference for all purposes, as well as in U.S. Pat. No. 5,235,550, entitled Method for Maintaining Optimum Biasing Voltage and Standby Current Levels in a DRAM Array Having Repaired Row to Column Shorts, also herein incorporated by reference for all purposes. U.S. Pat. No. 5,235,550 further depicts how a current limiting circuit may be incorporated into a memory circuit, such as a DRAM array.

Illustrated in drawing FIG. 2A, a plurality of digit line pairs (D1—D1*, D2—D2*, D3—D3*, and D4—D4*) is shown with its equilibrate circuitry. Node 22 is a local node shared with all common nodes of each set of equilibrate transistors (Q1A–Q1C, Q2A–Q2C, Q3A–Q3C, and Q4A–Q4C). A current limiting device 24 is placed in series between shared node 22 and the Vcc/2, also referred to as DVC2, voltage generator bus 26. This arrangement is repeated throughout the array, so that in the event of a row-to-column short within one or more of the digit lines of a particular digit line pair, only that pair will be affected. The current limiting device 24 incorporates a long length (long 1), depletion mode transistor 28 having its gate tied to the column lines (D and D*) while the drain is tied to DVC2. In this configuration, the gate voltage is reduced under row-to-column short conditions in such a manner as to limit the bleeder current $I_{DS}$, or the drain-to-source current. Further, bleeder circuit 20 utilizes current feedback to limit the current flow film the row-to-column short. This arrangement also provides for a much lower $I_{DS}$ bleed current for a given transistor dimension. In this example, the bleeder current $I_{DS}$ is limited to 1 microA.

Figure 2B:
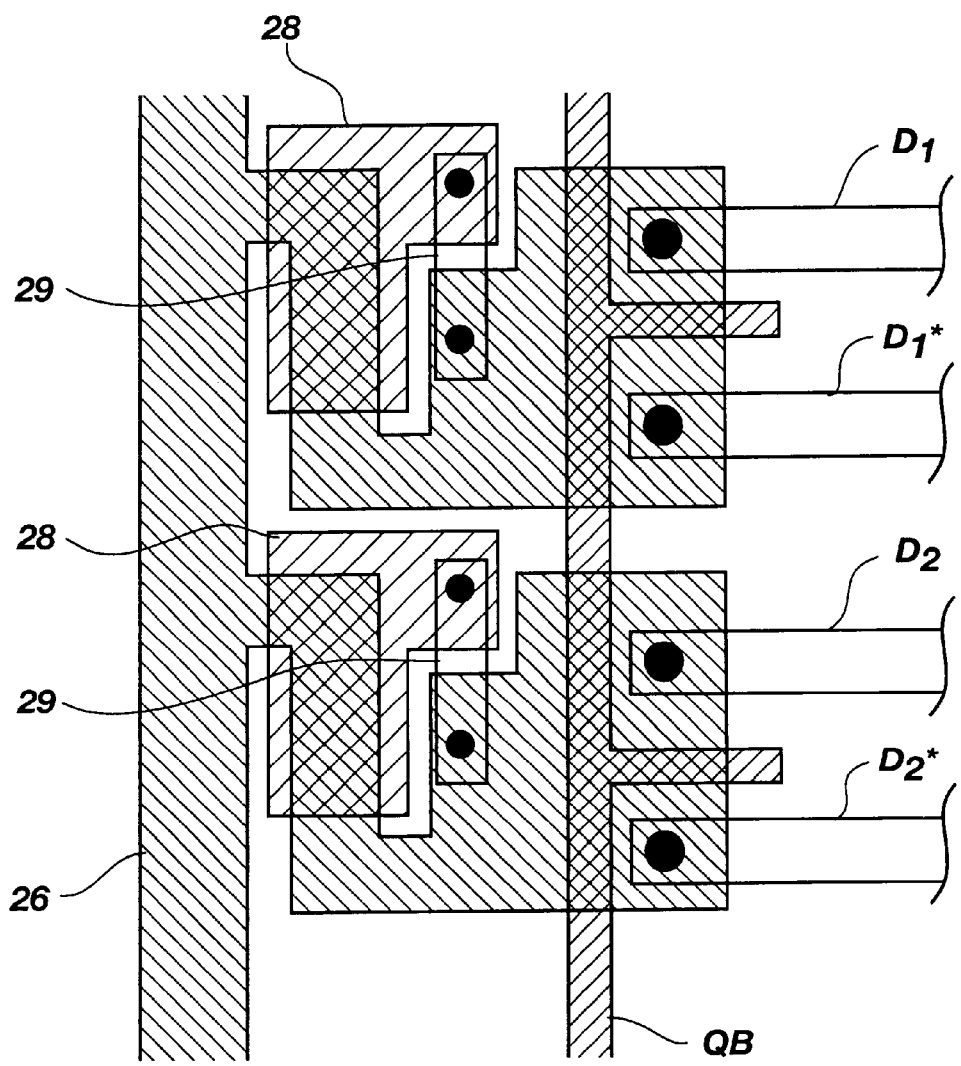

Illustrated in drawing FIG. 2B is a surface view of a memory array layout in a semiconductor substrate such as silicon. Bleeder circuit 20 conforms to the schematic diagram of 2A. Datalines D and D* are metal leads. A voltage generator bus 26 is an N+ semiconductor layer tied to the DVC2. Further, each transistor QN has its polysilicon gate tied to an equilibrate line. Next, the long depletion mode device 28 is formed of a polysilicon gate that is coupled using a short metal strap 29 that ties the gate to its drain.

Although a single current limiting device could conceivably be used for each digit line pair, this increases the cost of the die having such architecture, as the high number of current limiting devices required for such an architecture would significantly increase die size. On the other hand, all column pairs isolated from the bias voltage generator bus by a single current limiting device will be shorted to Vss if a row-to-column short exists on any of the digit lines among those column pairs. Hence, the tied column pairs must be replaced as a unit if any one or more of the digit lines among the tied column pairs is shorted to a word line. This constraint places a practical limit on the total number of digit line pairs associated with a single current limiting device. Typically, one or two column pairs will be tied to one current limiting device, although any number may be connected to a current limiting device.

Figure 3:
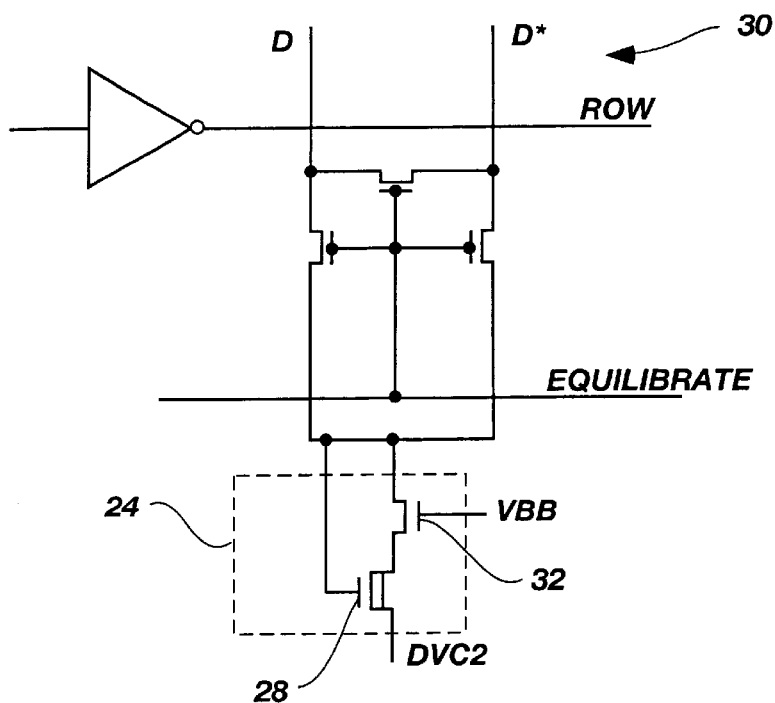
FIG. 3 depicts a schematic diagram of an alternative current limiting circuit for use in a DRAM array according to the present invention.
Figure 4:
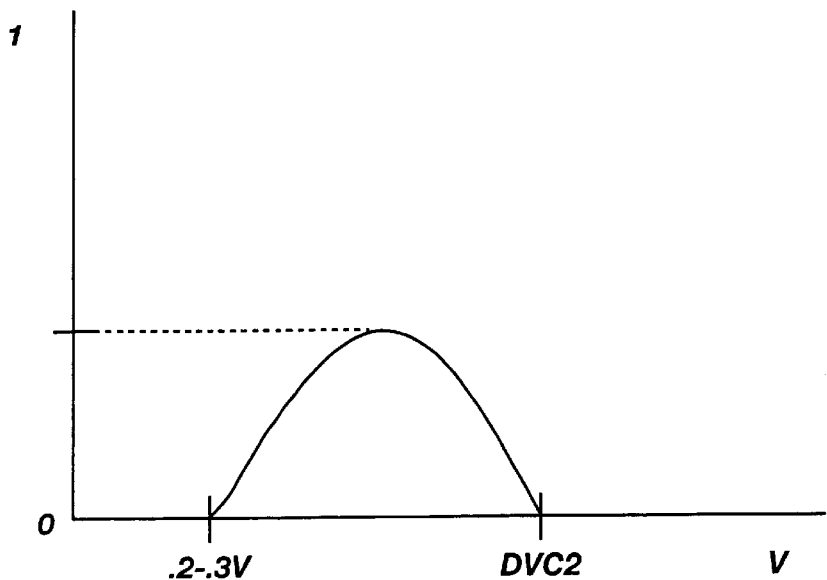
FIG. 4 is a graph diagram of the bleed current versus digit line voltage under row-to-column shorting.

Illustrated in drawing FIG. 3 is an alternative embodiment of a current limiting circuit according to the present invention. The redundancy shown in drawing FIGS. 2A and 2B has been eliminated merely for the sake of clarity. A low-current array bleeder circuit 30 is provided that uses a similar feedback arrangement or current limiting device 24 as that found in drawing FIGS. 2A and 2B, but further includes a second switch 32 connected to transistor 28. Switch 32 is a P-channel MOSFET having its gate tied to a negative supply voltage ($V_{bb}$). Switch 32 passes current in a row-to-column short mode until both digit and digit* lines (D, D*) approach approximately 3.0 V. At this voltage level, IDS becomes 0 A and no current flows. Illustrated in drawing FIG. 4 is a graph illustrating the effect of using bleeder circuit 20 or 30 according to the present invention. At a voltage level DV2, the voltage on D line causes the current to stop flowing. As the voltage decreases on D line, the bleeder current begins to flow until such a time as the voltage reaches approximately 0.2–0.3 V. At that time, the bleeder current ceases to flow or is now at 0.0 A.

Figure 5:
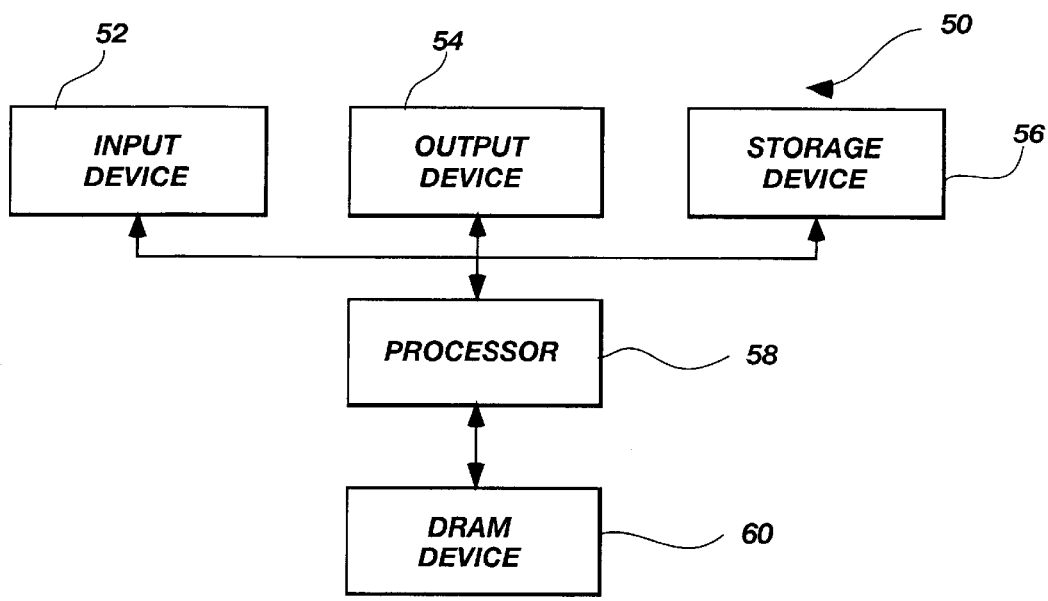
FIG. 5 is a block diagram of an electronic system incorporating the DRAM according to the present invention.

Illustrated in drawing FIG. 5 is a block diagram of a computer system 50. Computer system 50 includes an input device 52, such as a keyboard, an output device 54, such as a video monitor, and a storage device 56, all coupled to a conventional processor 58. The computer system 50 further includes a memory device, such as a dynamic random access memory (DRAM) device 60, coupled to processor 58. DRAM device 60 incorporates either embodiment of memory cells shown respectively in drawing FIGS. 2A, 2B, and 3. Although DRAM is the memory of discussion, it will be appreciated by those skilled in the art that the present invention includes other memory devices such as read only memory, cache memory, and video RAM.

Figure 6:
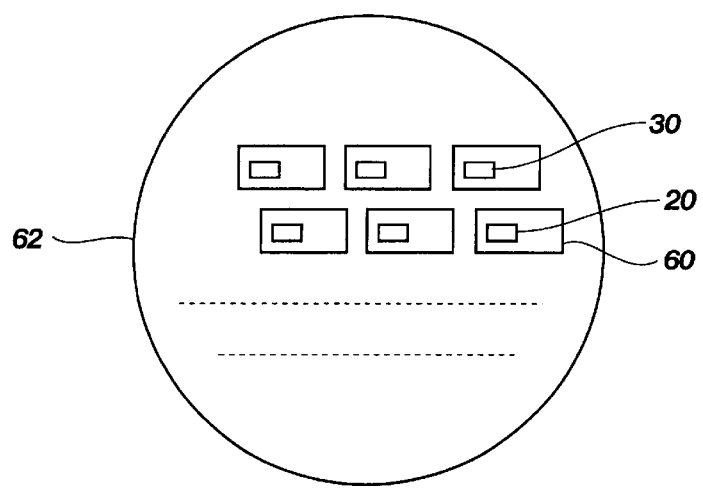
FIG. 6 is a diagram of a semiconductor wafer incorporating the DRAM of the present invention.

As shown in drawing FIG. 6, a DRAM device 60 that includes the DRAM portion 20 or 30 of FIG. 2 or 3, respectively, is fabricated on the surface of a semiconductor wafer 62. The wafer 62 may comprise a sliced wafer of silicon, or may comprise any one of a wide variety of substrates, including, for example, a Silicon-on-Sapphire (SOS) substrate, a Silicon-on-Insulator (SOI) substrate, or a Silicon-on-Glass (SOG) substrate.

While the present invention has been described in terms of certain preferred embodiments, it is not so limited, and those of ordinary skill in the art will readily recognize and appreciate that many additions, deletions and modifications to the embodiments described herein may be made without departing from the scope of the invention as hereinafter claimed.

What is claimed is:

1. A computer system comprising:
   an input device;
   an output device;
   a storage device;
   a processor coupled to said input, output, and storage devices;
   a memory circuit, coupled to said processor, the memory circuit comprising:

a plurality of complementary pairs of digit lines;
a row line, coupled to said plurality of complementary pairs of digit lines;
a plurality of memory cells, at least one of said plurality of memory cells being connected to at least one of said plurality of complementary pairs of digit lines; and
a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pair of digit lines when said at least one of said plurality of complementary pairs of digit lines is shorted, each of said plurality of current limiting circuits comprising a long length, depletion mode transistor having its gate connected to said plurality of complementary pairs of digit lines.

2. A computer system comprising:
an input device;
an output device;
a storage device;
a processor coupled to said input, output, and storage devices;
a memory circuit, coupled to said processor, the memory circuit comprising:
  a plurality of complementary pairs of digit lines;
  a row line, coupled to said plurality of complementary pairs of digit lines;
  a plurality of memory cells, at least one of said plurality of memory cells being connected to at least one of said plurality of complementary pairs of digit lines; and
  a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pair of digit lines when said at least one of said plurality of complementary pairs of digit lines is shorted, each of said plurality of current limiting circuits further comprises:
    a switching transistor, connected to said plurality of complementary pairs of digit lines, and having a gate node connected to a negative voltage supply; and
    a long length, depletion mode transistor, connected to said switching transistor and having a gate node connected to said plurality of complementary pairs of digit lines for providing feedback in controlling and limiting a bleed current when one of said plurality of complementary pairs of digit lines is shorted.

3. A computer system comprising:
an input device;
an output device;
a storage device;
a processor coupled to said input, output, and storage devices;
a memory circuit, coupled to said processor, the memory circuit comprising:
  a plurality of complementary pairs of digit lines;
  a row line, coupled to said plurality of complementary pairs of digit lines;
  a plurality of memory cells, at least one of said plurality of memory cells being connected to at least one of said plurality of complementary pairs of digit lines;
  a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pair of digit lines when said at least one of said plurality of complementary pairs of digit lines is shorted; and
  an equilibrate line connected to selected ones of said plurality of memory cells in a common row.

4. A computer system comprising:
an input device;
an output device;
a storage device;
a processor coupled to said input, output, and storage devices;
a memory circuit, coupled to said processor the memory circuit comprising:
  a plurality of complementary pairs of digit lines;
  a row line, coupled to said plurality of complementary pairs of digit lines;
  a plurality of memory cells, at least one of said plurality of memory cells being connected to at least one of said plurality of complementary pairs of digit lines; and
  a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pairs of digit lines when said at least one of said plurality of complementary pairs of digit lines is shorted with another line, each of said plurality of current limiting circuits comprises a long length, depletion mode transistor having its gate connected to said plurality of complementary pairs of digit lines.

5. A computer system comprising:
an input device;
an output device;
a storage device;
a processor coupled to said input, output, and storage devices;
a memory circuit, coupled to said processor, the memory circuit comprising:
  a plurality of complementary pairs of digit lines;
  a row line, coupled to said plurality of complementary pairs of digit lines;
  a plurality of memory cells, at least one of said plurality of memory cells being connected to at least one of said plurality of complementary pairs of digit lines; and
  a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pairs of digit lines when said at least one of said plurality of complementary pairs of digit lines is shorted with another line, each of said plurality of current limiting circuits further comprises:

a switching transistor, connected to said plurality of complementary pairs of digit lines, and having a gate node connected to a negative voltage supply; and a long length, depletion mode transistor, connected to said switching transistor and having a gate node connected to said plurality of complementary pairs of digit lines for providing feedback in controlling and limiting a bleed current when one of said plurality of complementary pairs of digit lines is shorted with said row line.

6. A computer system comprising:

an input device;

an output device;

a storage device;

a processor coupled to said input, output, and storage devices;

a memory circuit, coupled to said processor, the memory circuit comprising:

a plurality of complementary pairs of digit lines;

a row line, coupled to said plurality of complementary pairs of digit lines;

a plurality of memory cells, at least one of said plurality of memory cells being connected to at least one of said plurality of complementary pairs of digit lines;

a plurality of current limiting circuits, at least one of said plurality of current limiting circuits being connected to said at least one of said plurality of memory cells and said at least one of said plurality of complementary pairs of digit lines, that utilizes current feedback to limit a current flow through said plurality of complementary pairs of digit lines when said at least one of said plurality of complementary pairs of digit lines is shorted with another line; and an equilibrate line connected to selected ones of said plurality of memory cells in a common row.

* * * * *

UNITED STATES PATENT AND TRADEMARK OFFICE
CERTIFICATE OF CORRECTION

PATENT NO.    : 6,226,221 B1
DATED         : May 1, 2001
INVENTOR(S)   : Ma et al.

It is certified that error appears in the above-identified patent and that said Letters Patent is hereby corrected as shown below:

Column 2,
Line 41, after "transistor" insert -- . --;
Line 58, change "DRAWING" to -- DRAWINGS --;

Column 3,
Line 49, change "film" to -- from --;

Column 4,
Line 23, change "IDS" to -- $I_{DS}$ --; and
Line 28, after "such" delete "a";
Line 45, change "FIG" to -- FIGS. --.

Column 5,
Line 14, change "pair" to -- pairs --;
Line 41, change "pair" to -- pairs --;
Line 53, after "when" insert -- said at least --;

Column 6,
Line 10, change "pair" to -- pairs --;
Line 39, change "comprises" to -- comprising --; and Column 7,
Line 12, after "when" insert -- said at least --.

Signed and Sealed this

Twenty-fifth Day of June, 2002

*Attest:*

JAMES E. ROGAN
*Attesting Officer*           *Director of the United States Patent and Trademark Office*